United States Patent
Labyed et al.

(10) Patent No.: US 11,163,030 B2
(45) Date of Patent: Nov. 2, 2021

(54) BIOMARKER-CONSISTENT PHANTOM FOR MULTIPLE IMAGING MODALITIES

(71) Applicant: Siemens Medical Solutions USA, Inc., Malvern, PA (US)

(72) Inventors: Yassin Labyed, Maple Valley, WA (US); Andrzej Milkowski, Issaquah, WA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 3 days.

(21) Appl. No.: 16/834,261

(22) Filed: Mar. 30, 2020

(65) Prior Publication Data

US 2021/0156946 A1    May 27, 2021

Related U.S. Application Data

(60) Provisional application No. 62/941,047, filed on Nov. 27, 2019.

(51) Int. Cl.
*G01R 33/58*  (2006.01)
*G01R 33/48*  (2006.01)

(52) U.S. Cl.
CPC ......... *G01R 33/58* (2013.01); *G01R 33/4828* (2013.01)

(58) Field of Classification Search
USPC ...................................................... 324/309
See application file for complete search history.

(56) References Cited

U.S. PATENT DOCUMENTS

| | | |
|---|---|---|
| 4,277,367 A | 7/1981 | Madsen et al. |
| 10,036,796 B2 | 7/2018 | Reeder et al. |
| 2018/0047303 A1* | 2/2018 | Groenewald ......... A61B 6/583 |
| 2018/0242944 A1* | 8/2018 | Uber, III ............... A61B 8/587 |
| 2020/0383663 A1* | 12/2020 | Speidel ............... G09B 23/286 |

OTHER PUBLICATIONS

Faran, Jr. James J. "Sound Scattering by Solid Cylinders and Spheres", The Journal of the Acoustical Society of America, vol. 23, No. 4, Jul. 1951, (pp. 405-418, 24 total pages).

Hines, C.D. et al., "Validation of Fat Quantification with T2* Correction and Accurate Spectral Modeling in a Novel Fat-Water-Iron Phantom", Proc. Int'l. Soc. Mag. Reson. Med. vol. 17, Jan. 2009, (cover 1+2707, 2 total pages).

Madsen, Ernest L. et al., "Tissue mimicking materials for ultrasound phantoms", Medical Physics, vol. 5, No. 5, Sep./Oct. 1978, (pp. 391-394, 4 total pages).

* cited by examiner

*Primary Examiner* — Rodney E Fuller

(57) ABSTRACT

A system and method include determination of a value of a first biomarker, determination of a value of a first quantitative parameter of a first imaging modality corresponding to the determined value of the first biomarker, determination of a value of a second quantitative parameter of a second imaging modality corresponding to the determined value of the first biomarker, determination of physical characteristics of an imaging phantom associated with the value of the first biomarker, the value of the first quantitative parameter, and the value of the second quantitative parameter, and generation of an instruction to fabricate the imaging phantom based on the physical characteristics.

15 Claims, 10 Drawing Sheets

BIOMARKER-CONSISTENT PHANTOM FOR MULTIPLE IMAGING MODALITIES

CROSS-REFERENCE TO RELATED PATENT APPLICATIONS

The present application claims priority to U.S. Provisional Patent Application No. 62/941,047, filed Nov. 27, 2019, the contents of which are incorporated herein by reference for all purposes.

BACKGROUND

The presence and progression of disease may be determined by analyzing relevant organs and structures within the body. Biopsy or other invasive procedures allow for physical evaluation of these organs and structures, but are associated with potential medical complications. Medical imaging has been found to provide a suitable non-invasive substitute for physical examination in certain scenarios.

For example, the progression of liver steatosis was conventionally determined by obtaining a liver sample via biopsy and determining the proportion of fat cells to other cells in the sample. The proportion was then mapped to one of grades 0 to IV based on experimentally-derived tables. However, liver biopsy is associated with a mortality rate and is therefore undesirable if avoidable.

Magnetic resonance imaging can generate a value of an imaging parameter known as proton density fat fraction (PDFF). PDFF generally indicates the ratio of the number of protons of fat to the number of protons of fat and water within the imaged tissue. Although PDFF and the biopsy-based determination measure different physical quantities, medical professionals currently consider ranges of PDFF values as proxies for corresponding ranges of fat cell proportions. Accordingly, a PDFF value may be obtained and mapped to a steatosis grade for use in diagnosis and treatment planning, without the need for a biopsy.

It is desirable to facilitate the use of other imaging modalities, such as ultrasound imaging, to determine physical biomarker values which are usable for diagnosis and treatment planning. Moreover, due the expense and scarcity of modalities such as magnetic resonance imaging, it is also desirable to use parameter values obtained from ultrasound imaging as a substitute for magnetic resonance imaging parameter values which are established proxies for one or more physical biomarker values.

BRIEF DESCRIPTION OF THE DRAWINGS

The construction and usage of embodiments will become apparent from consideration of the following specification as illustrated in the accompanying drawings, in which like reference numerals designate like parts, and wherein.

DETAILED DESCRIPTION

The following description is provided to enable any person in the art to make and use the described embodiments and sets forth the best mode contemplated for carrying out the described embodiments. Various modifications, however, will remain apparent to those in the art.

Some embodiments facilitate the use of ultrasound imaging to determine physical biomarker values which are usable for diagnosis and treatment planning. For examples, some embodiments provide a phantom which exhibits an ultrasound imaging-derived acoustic parameter value (e.g., backscatter coefficient, attenuation coefficient and/or sound speed) which corresponds to a biomarker value (e.g., mass fat fraction, volume fat fraction) of the phantom. Such a phantom may be used to calibrate ultrasound devices which may then be used to acquire acoustic parameters associated with tissue and determine biomarker values therefrom.

In some embodiments, the phantom also exhibits a parameter value of another imaging modality (e.g., an MR-derived PDFF value) which corresponds (e.g., via a known mapping) to the biomarker value (e.g., fat fraction) of the phantom. Such a phantom may be used to validate the use of the ultrasound imaging parameter as a suitable proxy for the parameter of the other imaging modality for determining the value of the biomarker with respect to unknown tissue.

Figure 1:
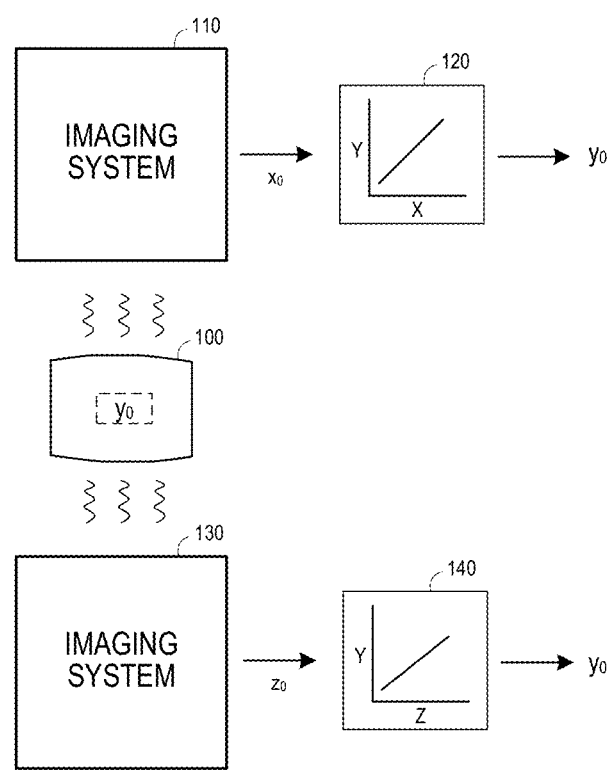
FIG. 1 illustrates imaging characteristics of a phantom according to some embodiments.

FIG. 1 illustrates use and characteristics of a phantom according to some embodiments. Phantom 100 exhibits a known value $y_0$ of a biomarker Y. In one non-exhaustive example, biomarker Y is a mass fat fraction. Phantom 100 may comprise any number of materials in any form factor that is or becomes known. According to some embodiments, phantom 100 includes oil (e.g., peanut oil), water, alcohol, and other materials.

Imaging system 110 employs a first imaging modality (e.g., ultrasound) to detect characteristics (e.g. values of acoustic parameters) of phantom 100. The detected characteristics are represented as value xo of acoustic parameter X. According to some embodiments, value xo may comprise a composite value determined based on values of several parameters detected by the first imaging modality.

Mapping 120 indicates a relationship between values of parameter X and values of parameter Y. Mapping 120 may be generated based on experimental data. As shown, mapping 120 maps detected value xo to value $y_0$. Accordingly, phantom 100 is constructed so as to exhibit an actual value of $y_0$ and to also exhibit a value xo of acoustic parameter X which maps to value $y_0$.

Similarly, imaging system 130 employs a second imaging modality (e.g., MR) to detect values of imaging parameters of phantom 100. The detected values are represented as value zo of imaging parameter Z. Again, value zo may comprise a composite value determined based on values of several parameters detected by the second imaging modality.

Mapping 140 indicates a relationship between values of parameter Z and values of parameter Y. Mapping 140 maps detected value zo to value $y_0$. Since the imaging parameter values acquired by imaging system 110 map to a same value $y_0$ as the imaging parameter values acquired by imaging system 130, phantom 100 may validate the use of imaging system 110 (or 130) to determine values of parameter Y, particularly in a case that the imaging modality of the other imaging system is considered suitable for determining values of parameter Y.

Figure 2:
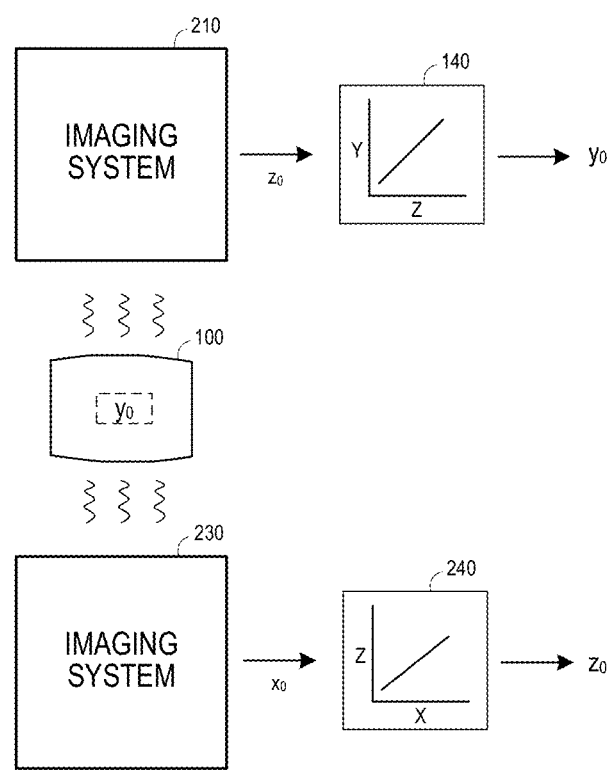
FIG. 2 illustrates imaging characteristics of a phantom according to some embodiments.

In this regard, FIG. 2 illustrates a system in which imaging system 210 employs a first imaging modality (e.g., MR) to detect characteristics of phantom 100. The detected characteristics are represented as value zo of parameter Z (e.g., PDFF). Mapping 140 maps detected value zo to value $y_0$ of parameter Y (e.g., mass fat fraction) as described above.

Imaging system 230 employs a second imaging modality (e.g., ultrasound) to detect characteristics of phantom 100 which are represented as value xo of imaging parameter X Mapping 240 maps detected value xo to value zo. Accordingly, phantom 100 may be used to show that imaging system 230 (e.g., ultrasound) may be used to generate the same values of parameter Z (e.g., PDFF) as are generated by imaging system 210 (e.g., MR). If the values of parameter Z are acceptable proxies of values of a biomarker, this showing may illustrate that values of parameter X should also be acceptable proxies.

Figure 3:
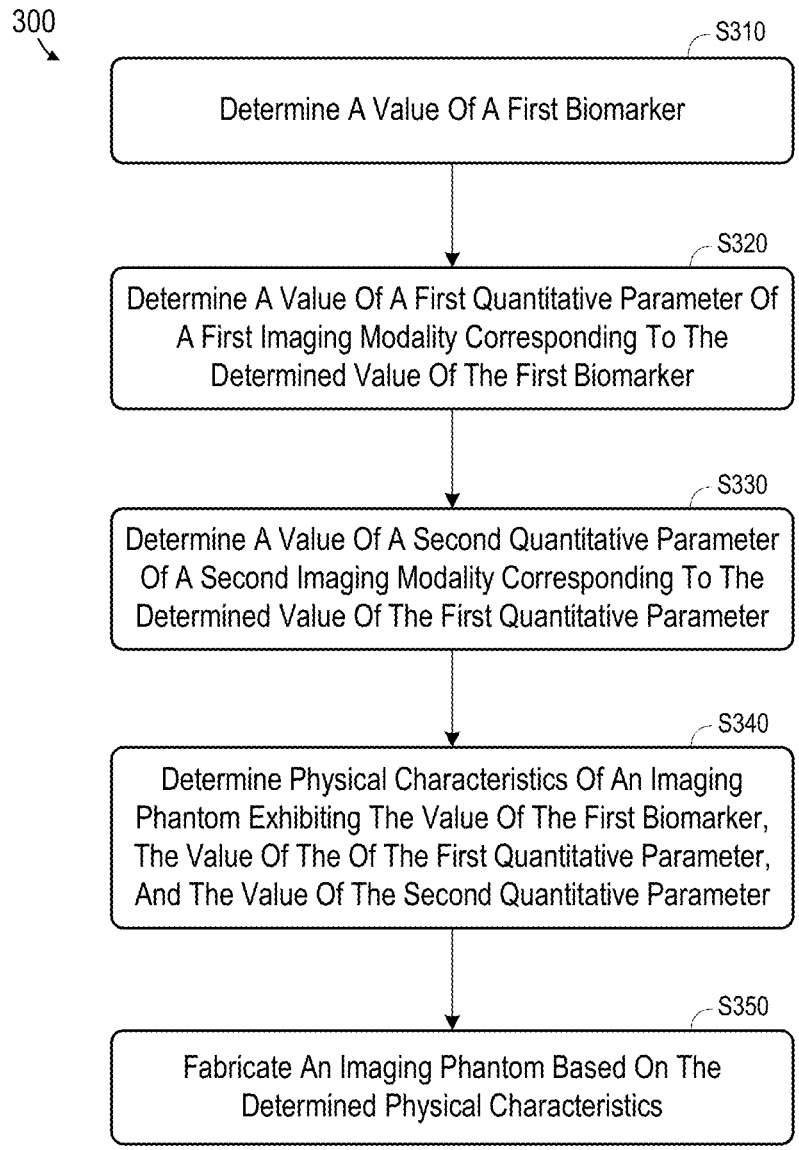
FIG. 3 is a flow diagram of a process to construct a phantom according to some embodiments.

FIG. 3 is a flow diagram of process 300 to construct an imaging phantom according to some embodiments. Some or all elements of process 300 and the other processes mentioned herein may be embodied in processor-executable program code read from one or more of non-transitory computer-readable media, such as a hard disk, volatile or non-volatile random access memory, a DVD-ROM, a Flash drive, and a magnetic tape, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

Process 300 generally describes construction of a phantom as depicted in FIG. 2. Initially, at S310, a value of a first biomarker is determined. Continuing with the prior examples, the value may be a fat fraction, such as 10% by volume.

Next, at S320, a value of a first quantitative parameter of a first imaging modality is determined. The value determined at S320 corresponds to the value of the first biomarker determined at S310. In some examples, the first imaging modality is MR imaging, and the first quantitative parameter is PDFF.

Figure 4A:
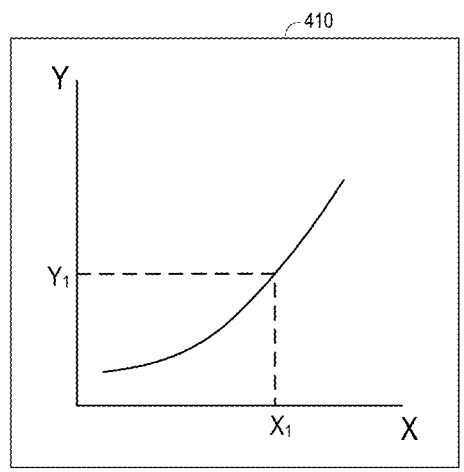
FIG. 4A illustrates a relationship between a biomarker and an imaging parameter according to some embodiments.

FIG. 4A illustrates mapping 410 for use in the determination at S320. It will be assumed that parameter Y is the volume fat fraction and value $y_1$ is 10%. The illustrated curve of mapping 410 illustrates an experimentally and/or theoretically-determined relationship between volume fat fraction and PDFF. Value xi of the first quantitative parameter of the first imaging modality is therefore determined at S320 based on the curve and value $y_1$ as illustrated.

A value of a second quantitative parameter of a second imaging modality is determined at S330. The value determined at S330 corresponds to the value of the first quantitative parameter determined at S320. In some examples, the second imaging modality is ultrasound imaging, and the second quantitative parameter is backscatter coefficient (BSC).

BSC is a measure of the ultrasound energy returned from tissue. Other quantitative ultrasound parameters may be considered at S330, such as but not limited to attenuation coefficient (AC) and sound speed. AC is a measure of the ultrasound energy loss in tissue and sound speed indicates a speed of sound through the tissue.

Figure 4B:
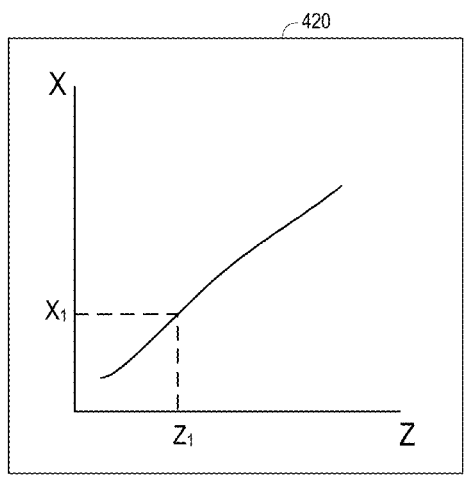
FIG. 4B illustrates a relationship between an imaging parameter of a first imaging modality and an imaging parameter of a second imaging modality according to some embodiments.

FIG. 4B illustrates mapping 420 for use in the determination at S330. The curve of mapping 420 illustrates an experimentally and/or theoretically-determined relationship between parameter X (e.g., PDFF) and second quantitative parameter Z. Value zi of the second quantitative parameter of the second imaging modality is therefore determined at S330 based on the curve and previously-determined value xi as illustrated.

According to some embodiments, values of more than one quantitative parameter of the second imaging modality are determined at S330. For example, a mapping may be available which maps values of the first quantitative parameter (e.g., PDFF) to values of each of two or more quantitative parameters (e.g., BSC and sound speed).

At S340, physical characteristics of a phantom are determined. The physical characteristics are determined such that a phantom having the determined characteristics will exhibit the determined value of the first biomarker, the determined value of the first quantitative parameter, and the determined value of the second parameter. As will be described below in detail with respect to process 500, S340 may comprise determining material droplet sizes and/or combinations of materials which will result in the desired characteristics. The physical characteristics may also specify fabrication details, such as mixing speed, temperature profiles, etc. Next, at S350, an imaging phantom is fabricated based on the physical characteristics determined at S340.

Figure 5:
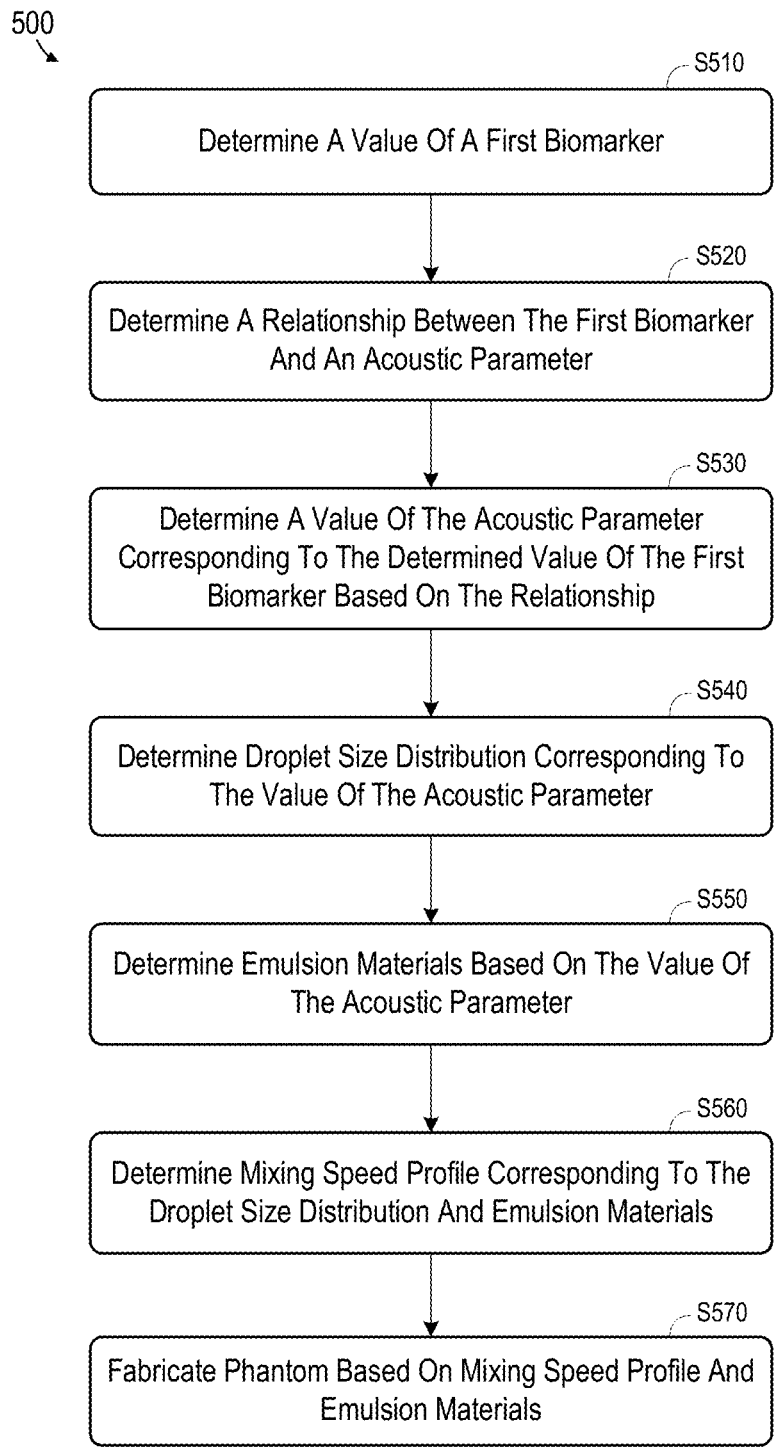
FIG. 5 is a flow diagram of a process to determine quantitative ultrasound values according to some embodiments.

Process 500 of FIG. 5 provides a specific example according to some embodiments. Initially, a value of a first biomarker is determined at S510 as described above. Next, at S520, a relationship between the first biomarker and an acoustic parameter is determined.

Figure 6:
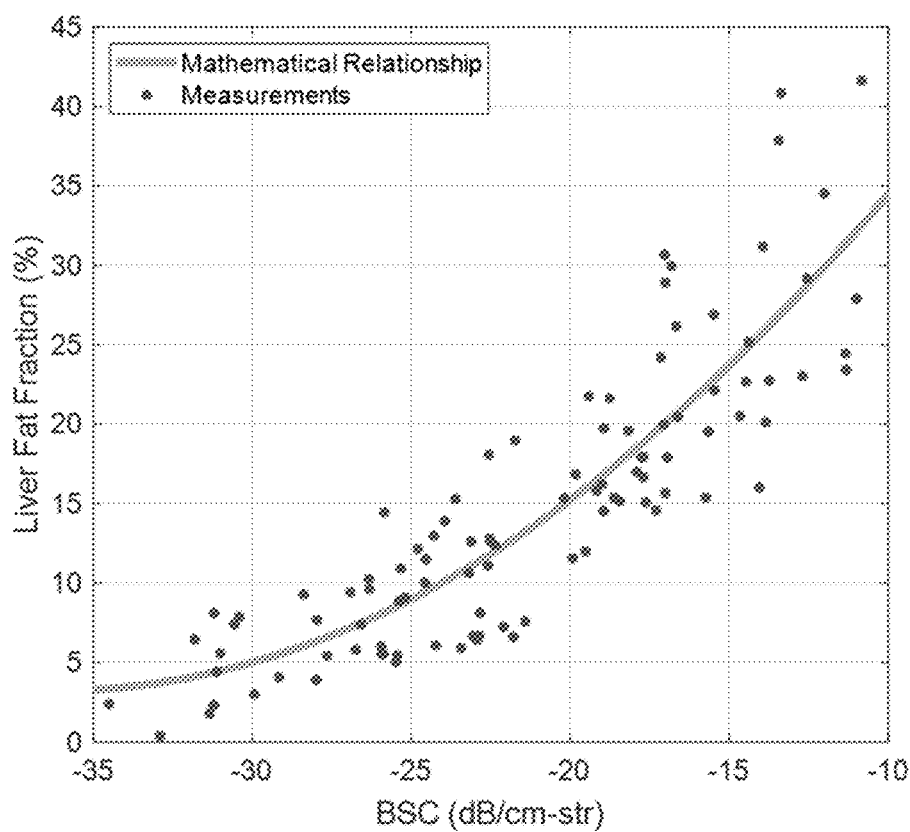
FIG. 6 illustrates a relationship between a liver fat fraction and a backscatter coefficient according to some embodiments.

FIG. 6 is a graph illustrating a relationship determined at S520 according to some embodiments. In particular, and in accordance with some non-exhaustive implementations, the FIG. 6 graph illustrates a mathematical relationship between BSC and liver fat fraction. As shown, the FIG. 6 graph plots observed measurements of BSC from clinical studies for various known fat fractions. The mathematical relationship is determined by fitting a curve to the plotted points. Any techniques for obtaining the data points and fitting the curve may be employed in some embodiments. According to some embodiments, the relationship is determined from theoretical equations based on first principles. In typical operation, the FIG. 6 graph is generated prior to process 500 and is simply accessed at S520.

At S530, a value of the acoustic parameter which corresponds to the value of the first biomarker is determined based on the mathematical relationship. In some embodiments, the value of the first biomarker is substituted into the relationship and the relationship is solved for a value of the acoustic parameter. The determined relationship, as shown in FIG. 6, may characterize the biomarker value as a function of the acoustic parameter value. Accordingly, as shown in FIG. 7, the relationship may be inverted to characterize the acoustic parameter value as a function of the biomarker value, thereby simplifying the calculation at S530.

Figure 7:
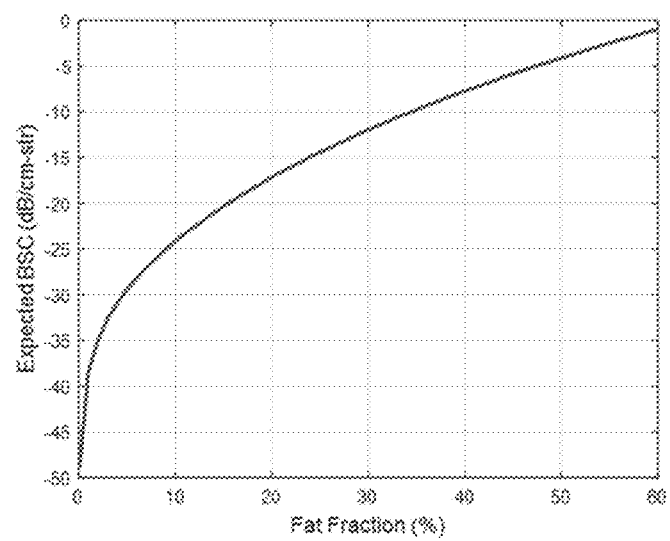
FIG. 7 illustrates a relationship between a liver fat fraction and a backscatter coefficient according to some embodiments.
Figure 8:
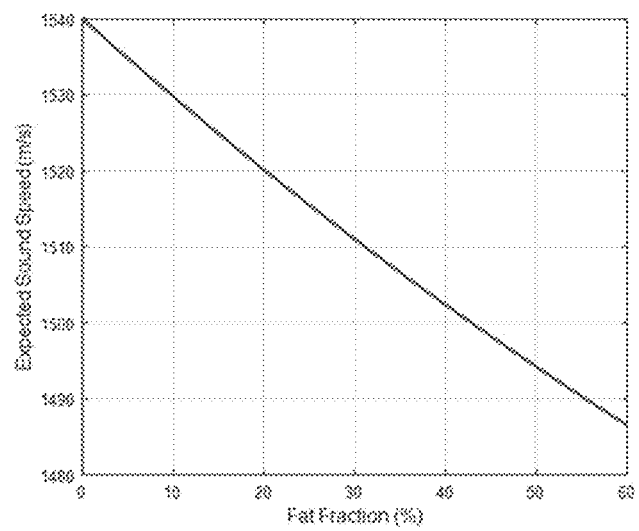
FIG. 8 illustrates a relationship between a liver fat fraction and a sound speed according to some embodiments.
Figure 9:
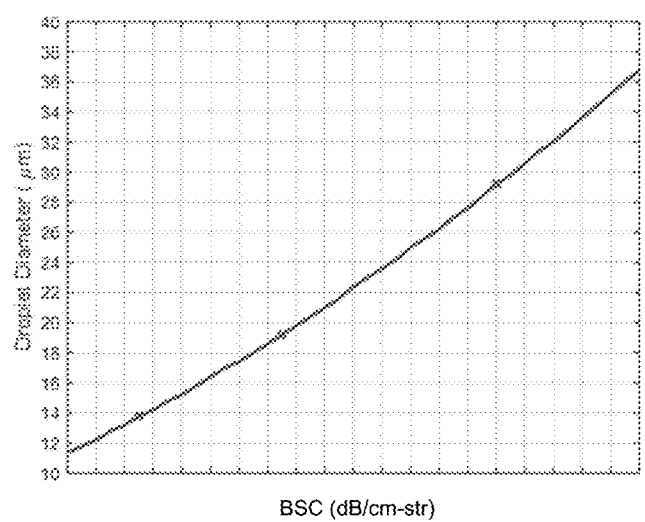
FIG. 9 illustrates a relationship between a liver fat fraction and a droplet diameter according to some embodiments.

FIG. 8 illustrates an inverted relationship as shown in FIG. 7, but which relates fat fraction to sound speed instead of to BSC. The FIG. 8 relationship may also be determined based on clinical studies and/or on equations derived from first principles.

A droplet size distribution is determined at S540 based on the determined value of the acoustic parameter. Since the droplet size distribution within a sample affects the BSC of the sample, the determination of droplet size distribution is performed in cases where BSC is the chosen acoustic parameter. Similarly, S550 is also or alternatively performed if the acoustic parameter is sound speed. S550 encompasses the determination of emulsion materials based on the value of the acoustic parameter. In this regard, sound speed associated with a mixture is generally determined by the sound speed of each ingredient, weighted according to each ingredient's percentage within the mixture. For a given fat fraction, the amount of oil within a phantom is fixed so additional emulsion materials may be substituted within the remaining percentage in order to achieve the desired sound speed.

Figure 10:
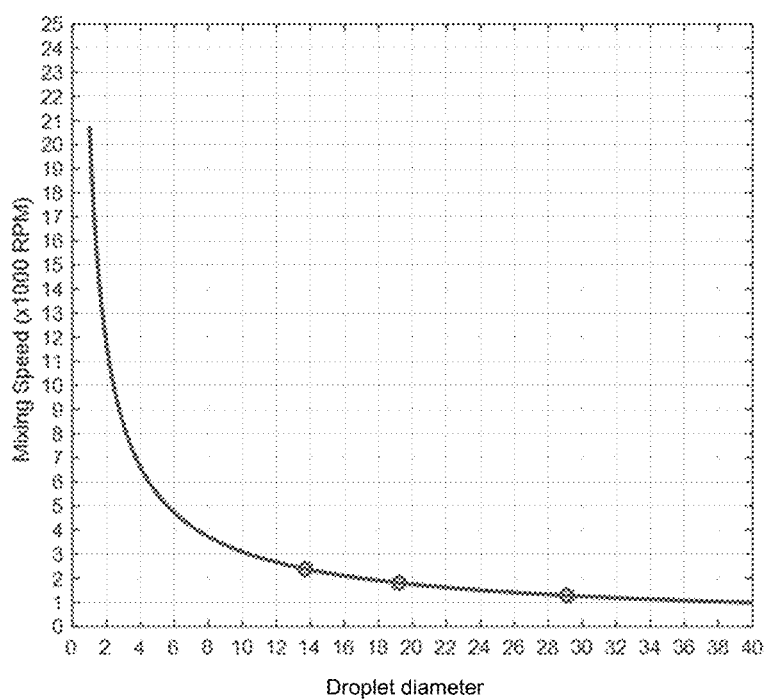
FIG. 10 illustrates a relationship between a droplet diameter and a mixing speed according to some embodiments.

At S560, a mixing speed profile corresponding to the droplet size distribution and emulsion materials. The profile may be determined from a lookup table corresponding to the particular oil being used (e.g., peanut, baby) and associating droplet size with mixing speed. FIG. 10 is a graphical illustration of data within such a lookup table according to some embodiments. The circles located on the graph signify droplet sizes corresponding to various fat fractions (e.g., 5%, 15%, 30%). The mixing speed profile determined at S560 is not limited to a single mixing speed over time.

S540, S550 or S560 may also comprise the determination of physical characteristics to ensure that the phantom exhibits a parameter (e.g., PDFF) of a second imaging modality (e.g., MR) which corresponds to the determined value of the first biomarker (e.g., fat fraction by volume). As described above, such a phantom may be used to validate the use of an acoustic ultrasound imaging-derived parameter as a suitable proxy for the parameter of the second imaging modality for determining the value of the biomarker with respect to unknown tissue.

According to one example, long T1 relaxation times of water in a water/oil emulsion may cause a bias in MR-obtained PDFF values. Therefore, it may be determined at S550 to add salts to the emulsion in order to reduce the relaxation times to values closer to those observed in human tissue. The addition of the salts might not significantly affect the exhibited acoustic parameters of the emulsion, however, in some embodiments, the added salts influence the determination of the droplet size at S540 and/or mixing speed S560.

A phantom is fabricated at S570 based on the determined mixing speed profile and emulsion materials. S570 may comprise providing the profile and material information to a phantom manufacturer. According to some embodiments, the fabricated phantom exhibits a true fat fraction which corresponds to a PDFF value which would be acquired via an MR scan of the phantom, and which also corresponds to a BSC, AC and/or sound speed value which would be acquired via an ultrasound scan of the phantom.

Figure 11:
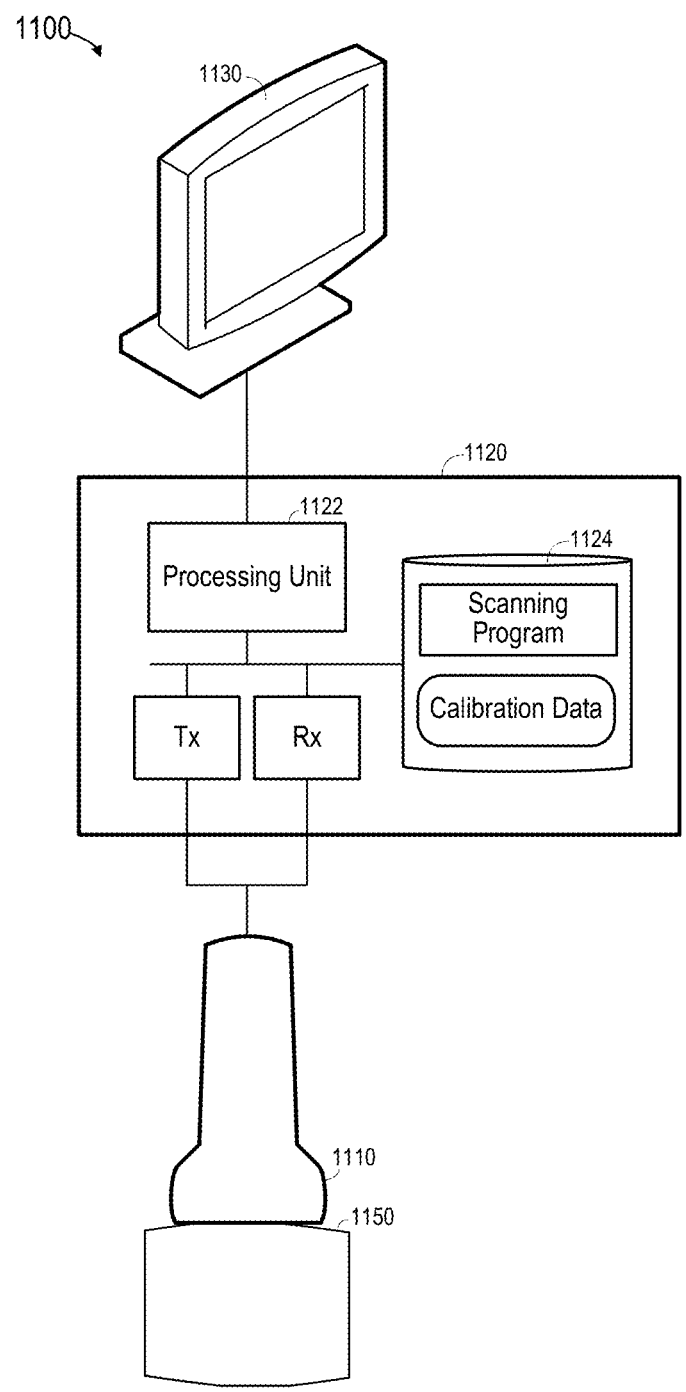
FIG. 11 is a block diagram of an ultrasound imaging system according to some embodiments.

FIG. 11 illustrates ultrasound system 1100 for acquiring acoustic parameters from thusly-fabricated phantom 1150. Since the biomarker value (e.g., fat fraction) of phantom 1150 is known, and the acoustic parameter value(s) which correspond to this biomarker value are known, FIG. 11 illustrates an arrangement for calibrating ultrasound system 1100 to perform biomarker value determination.

Ultrasound system 1100 includes ultrasound transducer 1110, ultrasound unit 1120 and display 1130. Ultrasound transducer 1110 may comprise any suitable ultrasound transducer, such as but not limited to a phased-array, linear or convex ultrasound transducer.

Generally, processing unit 1112 of unit 1110 may execute program code of a scanning program to control transducer 1110 to transmit ultrasound beams into phantom 1150 and receive acoustic radio-frequency signals therefrom. Processing unit 1122 of unit 1120 may execute program code to generate images and/or determine quantitative ultrasound values such as BSC, AC and/or sound speed based on the received signals. Processing unit 1122 may also determine and store calibration data based on differences between the acquired ultrasound values and corresponding known values of phantom 1150.

Figure 12:
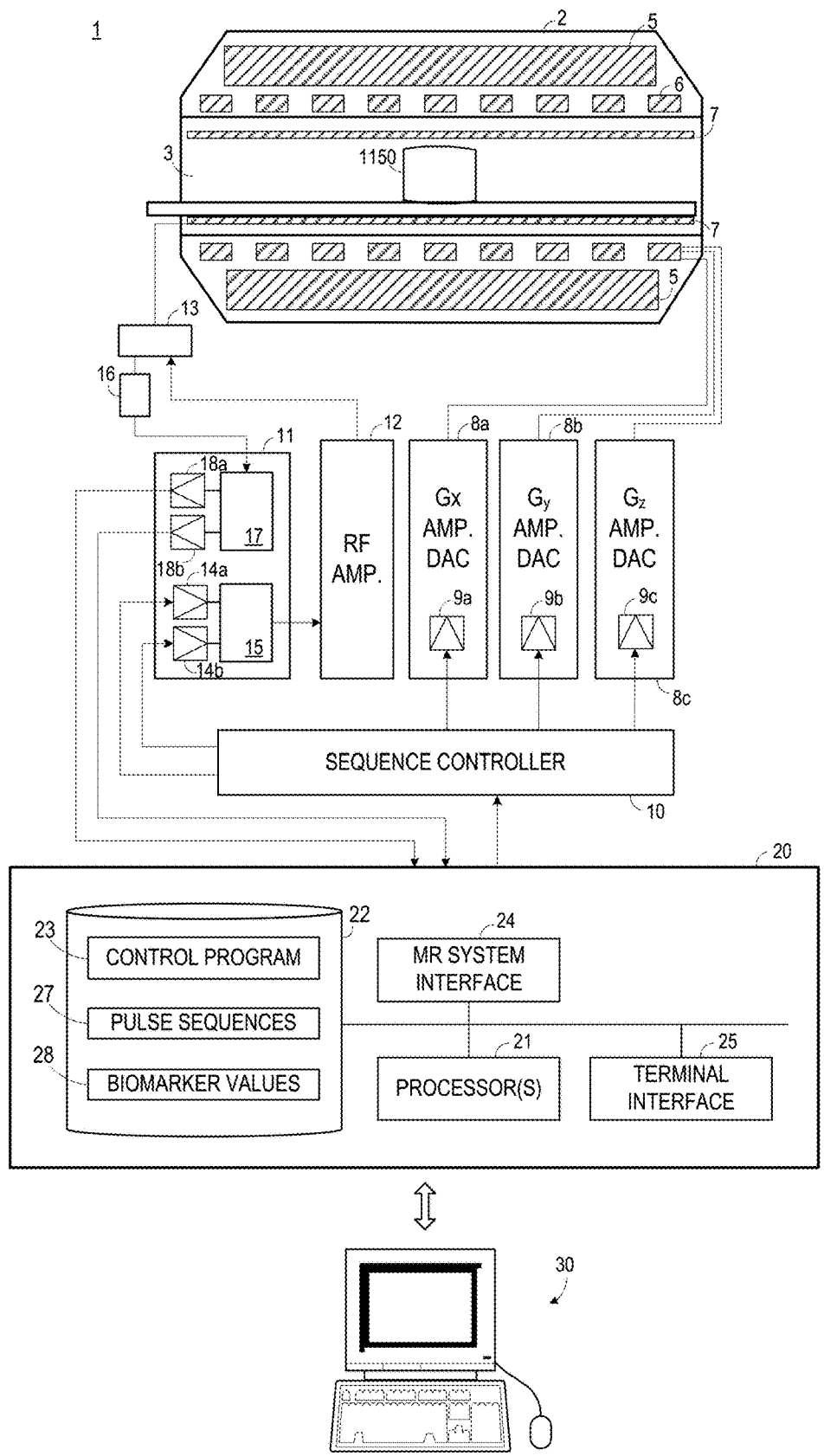
FIG. 12 is a block diagram of a magnetic resonance imaging system according to some embodiments.

FIG. 12 illustrates MR system 1 for executing pulse sequences according to some embodiments. Such pulse sequences may result in parameter values such as PDFF values as is known in the art. In particular, MR system 1 may scan phantom 1150 fabricated as described herein to generate a corresponding PDFF value. Since the biomarker value (e.g., fat fraction) of phantom 1150 is known, and the PDFF value which corresponds to this biomarker value are known, FIG. 12 illustrates an arrangement for calibrating MR system 1 to perform biomarker value determination.

MR system 1 includes MR chassis 2, which defines bore 3 in which patient 4 is disposed. MR chassis 2 includes polarizing main magnet 5, gradient coils 6 and RF coil 7 arranged about bore 3. According to some embodiments, polarizing main magnet 5 generates a uniform main magnetic field (Bo) and RF coil 7 emits an excitation field (Bi).

Gradient coils 6 produce magnetic field gradients $G_x$, $G_y$, and $G_z$ and are supplied with current by amplifiers $8a$-$8c$. Each amplifier $8a$-$8c$ includes a digital-analog converter $9a$-$9c$ which is controlled by a sequence controller 10 to generate desired gradient pulses at proper times. Sequence controller 10 also controls the generation of RF pulses by RF system 11 and RF power amplifier 12 using digital-analog converters $14a$-$14b$.

Transmission channel 15 modulates the pulse sequences with a radio-frequency carrier signal having a base frequency corresponding to the resonance frequency of the nuclear spins in the volume to be imaged. The received signals are received by multiplexer 13, amplified by RF amplifier 16 and demodulated in receiving channel 17 of RF system 11 in a phase-sensitive manner. Analog-digital converters $18a$ and $18b$ convert the demodulated signals into real and imaginary components from which computing system 20 reconstructs an image according to known techniques.

System 20 may comprise any general-purpose or dedicated computing system. Accordingly, system 20 includes one or more processing units 21 (e.g., processors, processor cores, execution threads, etc.) configured to execute processor-executable program code to cause system 20 to operate as described herein, and storage device 22 for storing the program code. Storage device 22 may comprise one or more fixed disks, solid-state random-access memory, and/or removable media (e.g., a thumb drive) mounted in a corresponding interface (e.g., a USB port).

Storage device 22 stores program code of control program 23. One or more processing units 21 may execute control program 23 to provide instructions to sequence controller 10 via MR system interface 24. For example, sequence controller 10 may be instructed to initiate a desired pulse sequence of pulse sequences 27. Pulse sequences 27 may include pulse sequences for acquiring biomarker values 28 such as PDFF values. Sequence controller 10 may be instructed to control the switching of magnetic field gradients via amplifiers 8a-8c at appropriate times, the transmission of radio-frequency pulses having a specified phase and amplitude at specified times via RF system 11 and RF amplifier 12, and the readout of the resulting MR signals.

Biomarker values and/or acquired images may be provided to terminal 30 via terminal interface 25 of system 20. Terminal interface 25 may also receive input from terminal 30, which may be used to provide commands to control program 23 in order to control sequence controller 10 and/or other elements of system 1. The commands may include commands to initiate an imaging sequence to acquire image data of a subject. Terminal 30 may simply comprise a display device and an input device coupled to system 20. In some embodiments, terminal 30 is a separate computing device such as, but not limited to, a desktop computer, a laptop computer, a tablet computer, and a smartphone.

Each element of system 1 may include other elements which are necessary for the operation thereof, as well as additional elements for providing functions other than those described herein. Storage device 22 may also store data and other program code for providing additional functionality and/or which are necessary for operation of system 20, such as device drivers, operating system files, etc.

Those in the art will appreciate that various adaptations and modifications of the above-described embodiments can be configured without departing from the scope and spirit of the claims. Therefore, it is to be understood that the claims may be practiced other than as specifically described herein.

What is claimed is:

1. A method comprising:
   determining a value of a first biomarker;
   determining a value of a first quantitative parameter of a first imaging modality corresponding to the determined value of the first biomarker;
   determining a value of a second quantitative parameter of a second imaging modality corresponding to the determined value of the first biomarker,
   determining physical characteristics of an imaging phantom associated with the value of the first biomarker, the value of the first quantitative parameter, and the value of the second quantitative parameter; and
   fabricating the imaging phantom based on the physical characteristics,
   wherein the first biomarker is a fat fraction, the first quantitative parameter is an ultrasound imaging quantitative parameter, and the second quantitative parameter is a proton density fat fraction.

2. A method according to claim 1, wherein the first quantitative parameter is backscatter coefficient and the determined physical characteristics comprise droplet size.

3. A method according to claim 1, wherein the first quantitative parameter is sound speed and the determined physical characteristics comprise proportions of oil, water and at least one other emulsion material.

4. A method comprising:
   determining a value of a first biomarker,
   determining a value of a second quantitative parameter of a second imaging modality corresponding to the determined value of the first biomarker,
   determining a value of a first quantitative parameter of a first imaging modality corresponding to the determined value of the second quantitative parameter of the second imaging modality;
   determining physical characteristics of an imaging phantom associated with the value of the first biomarker, the value of the first quantitative parameter, and the value of the second quantitative parameter; and
   fabricating the imaging phantom based on the physical characteristics.

5. A method according to claim 4, wherein the first biomarker is a fat fraction, the first quantitative parameter is an ultrasound imaging quantitative parameter, and the second quantitative parameter is a proton density fat fraction.

6. A method according to claim 5, wherein the first quantitative parameter is backscatter coefficient and the determined physical characteristics comprise droplet size.

7. A system comprising:
   a memory storing processor-executable process steps; and
   a processing unit to execute the processor-executable process steps to cause the system to:
   determine a value of a first biomarker;
   determine a value of a first quantitative parameter of a first imaging modality corresponding to the determined value of the first biomarker;
   determine a value of a second quantitative parameter of a second imaging modality corresponding to the determined value of the first biomarker,
   determine physical characteristics of an imaging phantom associated with the value of the first biomarker, the value of the first quantitative parameter, and the value of the second quantitative parameter; and
   generate an instruction to fabricate the imaging phantom based on the physical characteristics,
   wherein the first biomarker is a fat fraction, the first quantitative parameter is an ultrasound imaging quantitative parameter, and the second quantitative parameter is a proton density fat fraction.

8. A system according to claim 7, wherein the first quantitative parameter is backscatter coefficient and the determined physical characteristics comprise droplet size.

9. A system according to claim 7, wherein the first quantitative parameter is sound speed and the determined physical characteristics comprise proportions of oil, water and at least one other emulsion material.

10. A system comprising:
    a memory storing processor-executable process steps, and
    a processing unit to execute the processor-executable process steps to cause the system to:
    determine a value of a first biomarker,
    determine a value of a second quantitative parameter of a second imaging modality corresponding to the determined value of the first biomarker,
    determine a value of a first quantitative parameter of a first imaging modality corresponding to the determined value of the second quantitative parameter of the second imaging modality;
    determine physical characteristics of an imaging phantom associated with the value of the first biomarker, the value of the first quantitative parameter, and the value of the second quantitative parameter; and
    generate an instruction to fabricate the imaging phantom based on the physical characteristics.

11. A system according to claim 10, wherein the first biomarker is a fat fraction, the first quantitative parameter is an ultrasound imaging quantitative parameter, and the second quantitative parameter is a proton density fat fraction.

12. A system according to claim 11, wherein the first quantitative parameter is backscatter coefficient and the determined physical characteristics comprise droplet size.

13. An imaging phantom comprising:
a combination of materials exhibiting a first value of a first biomarker,
wherein, when scanned using a first imaging modality, the imaging phantom exhibits a value of a first quantitative parameter of the first imaging modality which corresponds to the first value of the first biomarker, and
wherein, when scanned using a second imaging modality, the imaging phantom exhibits a value of a second quantitative parameter of the first second modality which corresponds to the first value of the first biomarker, wherein the first biomarker is a fat fraction, the first quantitative parameter is an ultrasound imaging quantitative parameter, the second imaging modality is magnetic resonance imaging, and the second quantitative parameter is a proton density fat fraction.

14. A method according to claim 13, wherein the first quantitative parameter is backscatter coefficient.

15. A method according to claim 13, wherein the first quantitative parameter is sound speed.

* * * * *